(12) United States Patent
Zeng

(10) Patent No.: US 10,116,299 B2
(45) Date of Patent: Oct. 30, 2018

(54) POWER-ON RESET CIRCUIT

(71) Applicants: Semiconductor Manufacturing International (Shanghai) Corporation, Shanghai (CN); Semiconductor Manufacturing International (Beijing) Corporation, Shanghai (CN)

(72) Inventor: Linggang Zeng, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/273,472

(22) Filed: Sep. 22, 2016

(65) Prior Publication Data

US 2017/0104483 A1    Apr. 13, 2017

(30) Foreign Application Priority Data

Oct. 9, 2015 (CN) .......................... 2015 1 0646620

(51) Int. Cl.
*H03L 7/00* (2006.01)
*H03K 17/22* (2006.01)
(Continued)

(52) U.S. Cl.
CPC ............. *H03K 17/223* (2013.01); *G06F 1/24* (2013.01); *H03K 19/20* (2013.01)

(58) Field of Classification Search
CPC ......... H03K 17/223; H03K 19/20; G06F 1/24
(Continued)

(56) References Cited

U.S. PATENT DOCUMENTS 4,419,596 A * 12/1983 Kikuchi ............... H03K 3/0375
327/143
5,057,714 A * 10/1991 Hatano ............ H03K 19/09429
326/110
(Continued)

OTHER PUBLICATIONS

European Application No. 16191147.4, Extended European Search Report dated Feb. 24, 2017, 12 pages.

*Primary Examiner* — Kenneth B Wells
(74) *Attorney, Agent, or Firm* — Kilpatrick Townsend & Stockton LLP

(57) ABSTRACT

A power-on-reset circuit includes an execution circuit and a control circuit. The execution circuit includes a first input terminal connected to a power supply, a second input terminal and the first output terminal each initially are at a low level. The first output terminal transitions from the low level to a high level when the first input terminal and the second input terminal have a voltage not less than a predetermined voltage. The control circuit includes a third input terminal connected to the first output terminal, a fourth input terminal connected to the first input terminal, and a second output terminal connected to the second input terminal. The second input terminal transitions from the low level to the high level when a difference between the voltage at the first input terminal and the voltage at the first output terminal is greater than the predetermined voltage.

19 Claims, 8 Drawing Sheets

(51) Int. Cl.
*H03K 19/20* (2006.01)
*G06F 1/24* (2006.01)

(58) Field of Classification Search
USPC .......................................................... 327/143
See application file for complete search history.

(56) References Cited

U.S. PATENT DOCUMENTS

| | | | |
|---|---|---|---|
| 5,151,614 A | 9/1992 | Yamazaki et al. | |
| 5,767,710 A | 6/1998 | Cho | |
| 5,768,115 A * | 6/1998 | Pascucci | G11C 5/145 307/110 |
| 5,894,240 A * | 4/1999 | Shieh | G06F 1/24 327/142 |
| 7,268,598 B2 * | 9/2007 | Zolfaghari | H03K 17/22 327/143 |
| 8,427,798 B2 * | 4/2013 | Shimomura | H02H 9/046 361/56 |
| 8,963,590 B2 * | 2/2015 | Guimont | H03K 17/223 327/142 |

* cited by examiner

POWER-ON RESET CIRCUIT

CROSS-REFERENCES TO RELATED APPLICATIONS

This application claims priority to Chinese patent application No. 201510646620.7, filed on Oct. 9, 2015, the content of which is incorporated herein by reference in its entirety.

FIELD OF THE INVENTION

The present invention relates generally to integrated circuits. More particularly, embodiments of the present invention relate to power-on-reset circuitry and methods for performing power stability functions using a power-on-reset circuit when ramping up a power supply voltage of an integrated circuit device.

BACKGROUND OF THE INVENTION

With increased levels of integration of integrated circuits, it is possible to pack more and more functions into a single chip. A power-on-reset circuit is an indispensable component of System-on-Chip (SOC) applications, which provides a reset signal to a variety of digital circuit devices, so that they can start in a controlled manner during the ramp-up of the power supply voltage. In the initial stage of a system initialization, the various digital circuit devices in the SOC must be maintained stable when the power supply voltage ramps up to its final stable value. A power-on reset circuit provides a reset signal within the SOC to ensure that the system can start in a controlled manner. In the normal system operation phase, if the power supply voltage is too low, the power-on-reset circuit automatically generates a low logic level signal for the system until the supply voltage reaches its nominal operating condition, then the power-on-reset circuit will quickly provide a high logic level signal.

FIG. 1 shows a simplified block diagram of a conventional power-on-reset circuit, as known in the prior art. As shown in FIG. 1, the power-on-reset circuit includes a resistor R having a terminal connected to a supply voltage VDD and another terminal connected to a capacitor C at a node A. The node A is connected to a buffer having a hysteresis, which is configured to remove unwanted oscillation of the reset signal POR around the trip point. The Resistor R and the capacitor C form a simple RC delay circuit to delay the power supply voltage at the input of the buffer. The output POR is a delayed power supply signal which is configured to reset the integrated circuit or SOC. The value of the capacitor C is generally large requiring a large silicon area, thereby increasing the chip cost. The conventional power-on-reset circuit has a constant slew rate without the supply brown-out reset functions.

Since an on-chip power-on-reset circuit is required to support a wide range of different slow rates, brown-out reset, and it also has to meet the robustness, low power and low cost requirements, conventional power-on-reset circuits cannot satisfy all these requirements.

Thus, there is a need to provide a novel power-on-reset circuit and method to overcome the above-described drawbacks.

BRIEF SUMMARY OF THE INVENTION

Embodiments of the present invention provide a novel power-on-reset circuit. The power-on-reset circuit includes an execution circuit comprising a first input terminal, a second input terminal, and a first output terminal. The first input terminal is connected to a power supply voltage, a voltage at the second input terminal has a low level at an initial state, and a voltage at the first output terminal has a low level. The voltage at the first output terminal transitions from the low level to a high level when the power supply voltage at the first input terminal and the voltage at the second input terminal are not less than a predetermined voltage. The power-on-reset circuit also includes a control circuit comprising a third input terminal connected to the first output terminal, a fourth input terminal connected to the first input terminal, and a second output terminal connected to the second input terminal. The voltage at the second input terminal transitions from the low level to the high level when a difference between the power supply voltage at the first input terminal and the voltage at the first output terminal is greater than a predetermined voltage difference.

In one embodiment, the execution circuit includes a NAND gate and an inverter. The NAND gate has a first input terminal connected to the first input terminal of the execution circuit, a second input terminal connected to the second input terminal of the execution circuit, and an output terminal connected to an input terminal of the inverter. The inverter has an output terminal connected to the first output terminal of the execution circuit.

In one embodiment, the control circuit includes a charge module, a voltage difference detection module, a step-down module, and a set of inverters. The charge module includes an input terminal connected to the first input terminal of the execution circuit, an output terminal connected to an input terminal of the set of inverters. The charge module is configured to be charged to raise a voltage at its output terminal when the power supply voltage starts rising. The voltage difference detection module includes a first input terminal connected to the first input terminal of the execution circuit, a second input terminal connected to the first output terminal of the execution circuit, and an output terminal connected to an input terminal of the step-down module. The voltage difference detection module is configured to provide a control signal to the step-down module when the difference between the power supply voltage at the first input terminal and the voltage at the first output terminal is greater than the predetermined voltage. The step-down module includes an input terminal connected to an input terminal of the set of inverters. The step-down module is configured to drive a voltage at the input terminal of the set of inverters to the low level in response to the control signal. The set of inverters includes an output terminal connected to the second input terminal of the execution circuit. The set of inverters is configured to convert a low level signal at its input terminal to a high level signal at its output terminal, and convert a high level signal at its input terminal to a low level signal at its output terminal.

In one embodiment, the charge module includes a capacitor. The voltage difference detection module includes a first PMOS transistor having a substrate connected to the first input terminal of the execution circuit, a gate connected to the first output terminal of the execution circuit, a source connected in series with a reverse-biased diode-type circuit to the power supply voltage, and a drain connected in series to a forward biased diode-type circuit to a low voltage terminal.

In one embodiment, the step-down module includes a first NMOS transistor having a gate connected to the drain of the first PMOS transistor, a drain connected to the input terminal the input terminal of the set of inverters, and a source and a substrate connected to the low voltage terminal.

In one embodiment, the control circuit further comprises a feedback module having an input terminal connected to the second input terminal of the execution circuit, an output terminal connected to the input terminal of the set of inverters. The feedback module is configured to maintain the voltage at the input terminal of the set of inverters at the low level when the voltage at the second input terminal of the execution circuit is at the high level.

In one embodiment, the feedback module includes a second PMOS transistor and a second NMOS transistor, the second PMOS transistor having a source and a substrate connected to the second input terminal of the execution circuit, a gate and a drain connected to a gate of the NMOS transistor, the NMOS transistor having a drain connected to the input terminal of the set of inverters, a source and a substrate connected to a low voltage terminal.

In one embodiment, the set of inverters includes an odd number of inverters containing a last-stage inverter. The last-stage inverter has an output terminal connected to the second input terminal of the execution circuit. In one embodiment, the last-stage inverter includes a third PMOS transistor having a gate connected to its input terminal, a drain connected to its output terminal, a source connected in series with a reverse-biased diode-type circuit to the power supply voltage, and a substrate connected to the power supply voltage.

In one embodiment, the NAND gate includes a fourth PMOS transistor having a gate connected to the second input terminal of the execution circuit, a drain connected to the output terminal of the NAND gate, a source connected in series with a reverse-biased diode-type circuit to the power supply voltage, and a substrate connected to the power supply voltage.

In one embodiment, the diode-type circuit includes a PMOS transistor or an NMOS transistor having a drain and a gate connected to each other.

Embodiments of the present invention also provide a method for operating a power-on-reset circuit, wherein the power-on-reset circuit includes an execution circuit having first and second input terminals and a first output terminal, and a control circuit having a third input terminal connected to the first output terminal, a fourth input terminal connected to the first input terminal, and a second output terminal connected to the second input terminal, the first input terminal connected to a power supply voltage, and a voltage at the second terminal being a low level at an initial state. The method includes monitoring a voltage at the first input terminal and a voltage at the second input terminal, transitioning a voltage at the first output terminal of the execution circuit from a low level to a high level if a voltage at the first input terminal and the voltage at the second input terminal are not less than a predetermined voltage, determining whether a difference between the voltage at the first input terminal and the voltage at the first output voltage is greater than a predetermined voltage difference. In the event that the difference is greater than the predetermined voltage difference, the method includes transitioning the voltage at the second output terminal from a low level to a high level by the control circuit.

In one embodiment, the execution circuit comprises a NAND gate and an inverter, the NAND gate having a first input terminal connected to the first input terminal of the execution circuit, a second input terminal connected to the second input terminal of the execution circuit, and an output terminal connected to an input terminal of the inverter, and the inverter having an output terminal connected to the first output terminal of the execution circuit.

In one embodiment, the method further includes maintaining the voltage at the second input terminal at the low level, in the event that the difference is not greater than the predetermined voltage difference.

In one embodiment, maintaining the voltage at the second input terminal at the low level includes charging the charge module when the voltage at the first input terminal ramps up, the charge module having an input terminal connected to the first input terminal and an output terminal connected to an input terminal of the set of inverters; and driving (asserting) the voltage at the output of the set of inverters to the low level when the voltage at its input terminal reaches the high level, the output terminal of the set of inverters connected to the second input terminal.

In one embodiment, the control circuit comprises a charge module, a voltage difference detection module, a step-down module, and a set of inverters. The method further includes, when the voltage at the first input terminal and a voltage at the second input terminal are determined by the voltage difference detection module to be greater than the predetermined voltage difference, providing a control signal by the voltage difference detection module to the step-down module; driving (asserting) the voltage at the input terminal of the set of inverters to the low level by the step-down module in response to the control signal; and asserting the voltage at an output terminal of the set of inverters high, wherein the output terminal of the set of inverters is connected to the second output terminal.

In one embodiment, the method further includes maintaining the voltage at the input terminal of the set of inverters to the low level by a feedback module when the voltage at the second input terminal is at the high level, the feedback module having an input terminal connected to the second input terminal.

The following description, together with the accompanying drawings, will provide a better understanding of the nature and advantages of the claimed invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," or "low" are used interchangeably. The terms "logic high," "high state," "high level," "logic high level," or "high" are used interchangeably.

Figure 1:
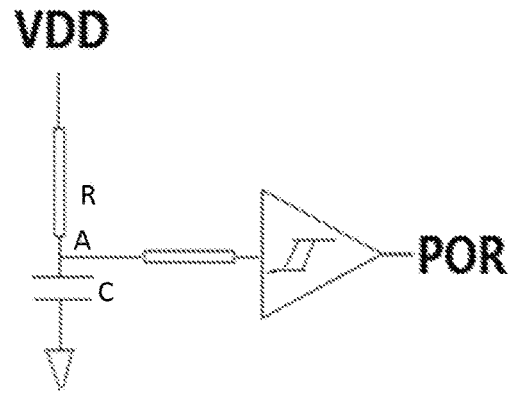
FIG. 1 is a simplified circuit block diagram of a conventional power-on-reset circuit, as known in the prior art.
Figure 2:
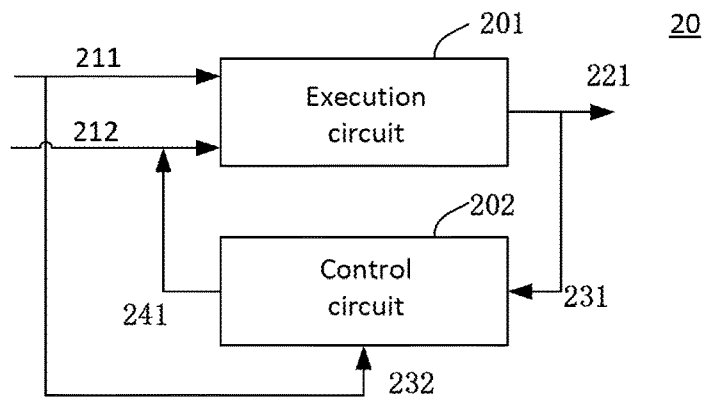
FIG. 2 is a simplified block diagram of a power-on-reset circuit according to an embodiment of the present invention.

FIG. 2 is a simplified block diagram of a power-on-reset circuit 20 according to an embodiment of the present invention. As shown in FIG. 2, the power-on-reset circuit 20 includes an execution circuit 201 and a control circuit 202. The execution circuit 201 includes a first input terminal 211, a second input terminal 212, and a first output terminal 221. The first input terminal 211 is connected to a power supply voltage. When a power supply voltage level at the first input voltage 211 and a voltage level of the second input terminal 212 are not less than a predetermined voltage, the output terminal 221 is transitioning from a low level to a high level.

The predetermined voltage is the high threshold voltage of the execution circuit 201.

In some embodiments, the execution circuit 201 may be implemented with logic gates, or with a combination of NAND gates and inverters, but not limited to these combinations. If the execution circuit 201 is implemented with logic gates, then the high voltage level of the threshold circuit is the high threshold voltage of the logic gate.

The control circuit 202 includes a third input terminal 231, a fourth input terminal 232, and a second output terminal 241. The third input terminal 231 is connected to the first output terminal 221, the fourth input terminal 232 is connected to the first input terminal 211, the second output terminal 241 is connected to the second input terminal 212. When the voltage difference between the first input terminal 211 and the output terminal 221 is greater than a predetermined voltage difference, the voltage at the second input terminal 212 transitions from low to high.

The predetermined voltage difference can be determined based on actual circuit characteristics. For example, the voltage difference detection circuit of the control circuit 202 may be a PMOS transistor having a substrate connected to the power supply voltage, the first output terminal 221 is connected to the gate of the PMOS transistor, when the power supply voltage rises to the turn-on voltage of the PMOS transistor, then the predetermined voltage difference is reached.

In accordance with the present invention, the power-on-reset circuit includes an execution circuit and a control circuit. The execution circuit includes a first input terminal, a second input terminal, and a first output terminal. The first input terminal is connected to a power supply voltage. When the voltage of the first input terminal and the voltage of the second input terminal are not less than a predetermined voltage, the first output terminal transitions from low to high. The control circuit includes a third input terminal and a fourth input terminal. The third input terminal is connected to the first output terminal, the fourth input terminal is connected to the first input terminal, the second output terminal is connected to the second input terminal. When the voltage difference between the first input terminal and the first output terminal is greater than a predetermined voltage difference, the voltage level of the second input voltage transitions from low to high, thereby realizing a power-on-reset circuit operating in a wide voltage range and with different slew rates.

Figure 3:
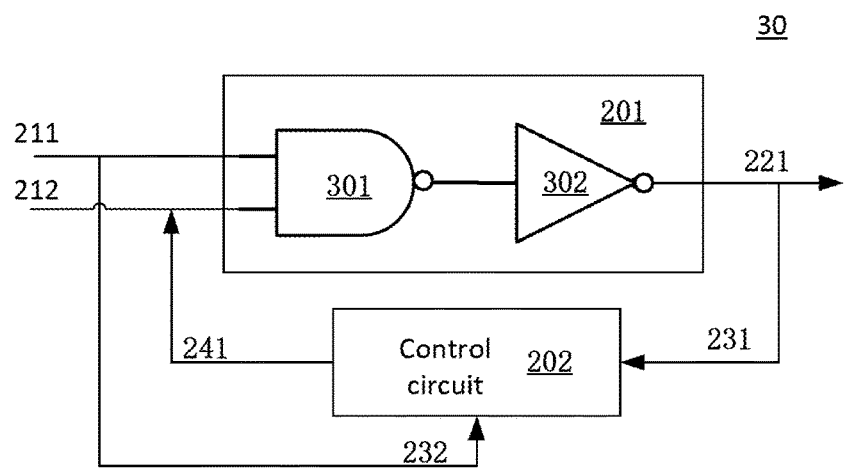
FIG. 3 is a simplified block diagram of a power-on-reset circuit according to another embodiment of the present invention.

FIG. 3 is a simplified block diagram of a power-on-reset circuit 30 according to another embodiment of the present invention. As shown in FIG. 3, the power-on-reset circuit 30 includes an execution circuit 201 and a control circuit 202. The execution circuit 201 includes a NAND gate 301 and an inverter 302. The execution 201 includes a first input terminal 211, a second input terminal 212, and a first output 221.

The first input terminal 211 and the second input terminal 212 each are connected to one of the inputs of the NAND gate 301. An output terminal of the NAND gate is connected to an input terminal of the inverter 302. An output terminal of the inverter 302 is connected to the first output terminal 221. The initial state of the second input terminal 212 is low.

When the voltage level at the first and second input terminals 211 and 212 is high, the output terminal of the NAND gate 301 is low, so that the voltage at the first output terminal is high. When both of the first and second input terminals are not high, the voltage of the first output terminal is low.

Figure 4:
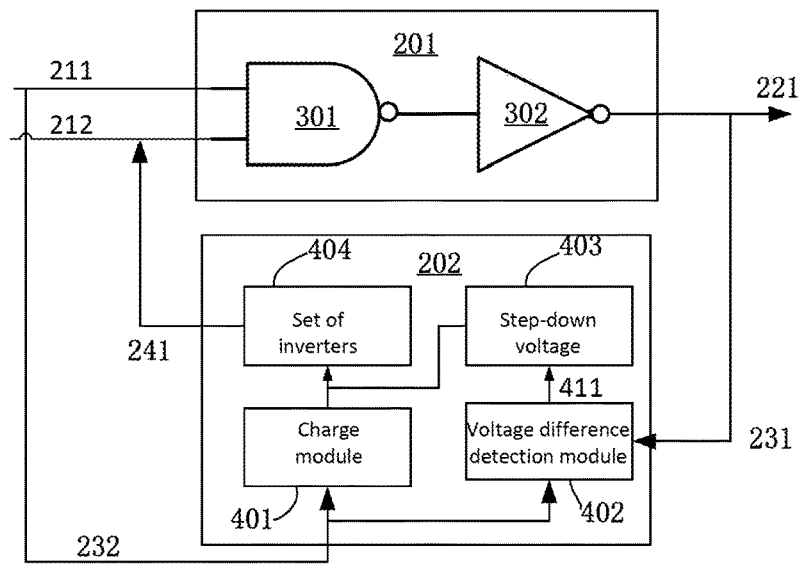
FIG. 4 is a simplified block diagram of a power-on-reset circuit according to yet another embodiment of the present invention.

FIG. 4 is a simplified block diagram of a power-on-reset circuit 40 according to yet another embodiment of the present invention. The power-on-reset circuit 40 differs from the power-on-reset circuit 30 in that, the control circuit 202 includes a charge module 401, a voltage difference detection module 402, a step-down module 403, and a set of inverters 404.

The charge module 401 has an input terminal connected to the fourth input terminal 232 and an output terminal connected to an input terminal of the set of inverters 404. When the voltage at the first input terminal 211 rises, the charge module 401 starts to charge, and the voltage at its output terminal increases.

In some embodiments, the charge module 401 includes a small-capacity capacitor having a capacitance value in the range between about 100 fF and about 1 pF.

The voltage difference detection module 402 includes two input terminals connected separately to the fourth input terminal 232 and the third input terminal 231, which, in turn, are connected to the first input terminal 211 and the first output terminal 221, respectively. The voltage difference detection module 402 further includes an output terminal connected to an input terminal of the step-down module 403. When the voltage difference between the first input terminal 211 and the first output terminal 221 is greater than a predetermined voltage difference, the voltage difference detection module 402 sends a control signal 411 to the step-down module 403.

In some embodiments, the voltage difference detection module 402 may include a PMOS transistor having a substrate connected to a power supply voltage, and a gate connected to the first output terminal 221. When the gate voltage reaches the turn-on voltage of the PMOS transistor, the voltage difference between the first input terminal 211 and the first output terminal 221 reaches the predetermined voltage difference.

The step-down voltage 403 has an output terminal connected to an input terminal of the set of inverters 404. When the step-down voltage 403 receives the control signal 411 from the voltage difference detection module 402, the step-down voltage 403 asserts a low state to the input voltage of the set of inverters.

In a specific embodiment, the step-down voltage 403 may include an NMOS transistor having a gate connected to the drain of the PMOS transistor, and a drain connected to the input terminal of the set of inverters 404, a source, and a substrate connected to a low level signal terminal VSS. That is, when the PMOS transistor is turned on, the voltage at its gate increases so that the NMOS is turned on and pulls its drain to low.

The set of inverters 404 has an output terminal connected to the second output terminal 241. When the input terminal of the set of inverters 404 is low, its output terminal is high. Conversely, when the input terminal of the set of inverters 404 is high, its output terminal is low.

In some embodiments, the set of inverters 404 has an odd number of inverters connected in series. The output terminal of the last-stage inverter is connected to the second input terminal 212.

Figure 5:
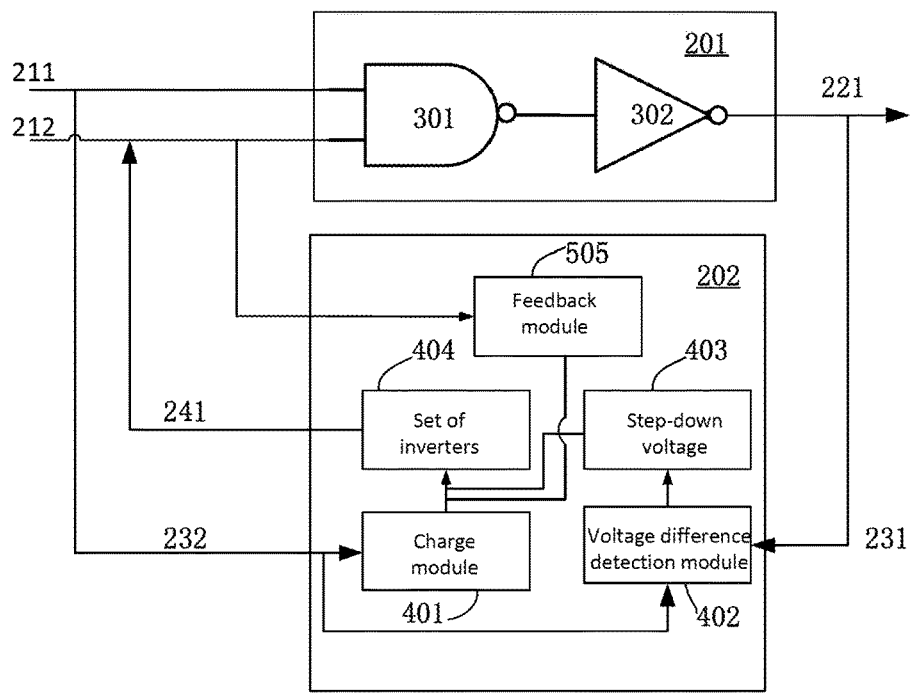
FIG. 5 is a simplified block diagram of a power-on-reset circuit according to another embodiment of the present invention.

FIG. 5 is a simplified block diagram of a power-on-reset circuit 50 according to another embodiment of the present invention. The power-on-reset circuit 50 differs from the power-on-reset circuit 40 in that, the control circuit 202 further includes a feedback module 505.

The feedback module 505 has an input terminal connected to the second input terminal 212, and an output terminal connected to the input terminal to the set of inverters 404. The feedback module 505 is configured to ensure that, when the second input terminal 212 is high, the voltage level of the input terminal of the set of the inventors 404 is maintained low.

Figure 6:
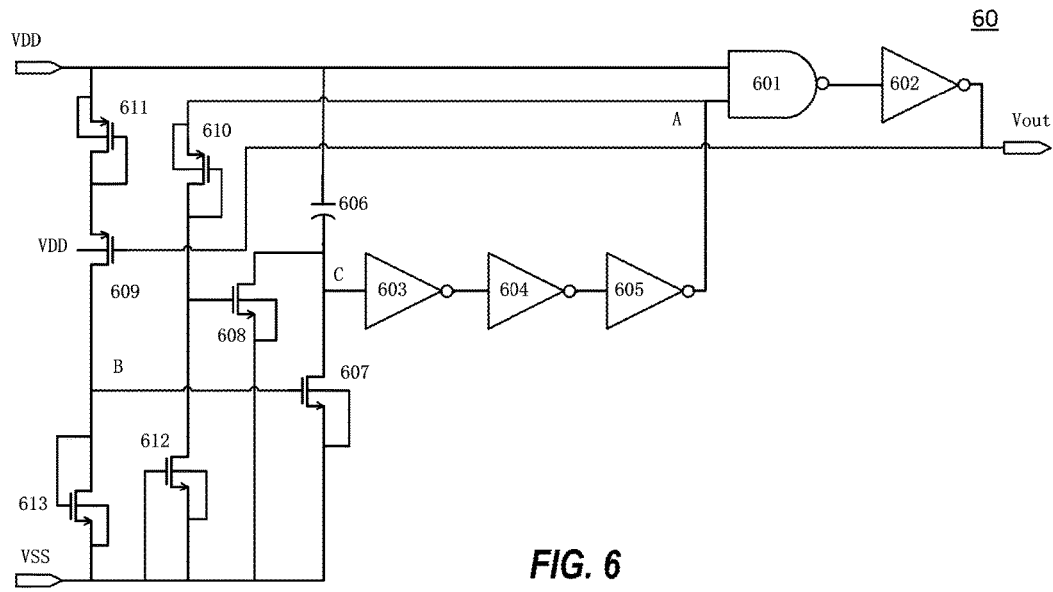
FIG. 6 is a simplified circuit diagram of a power-on-reset circuit according to an embodiment of the present invention.

FIG. 6 is a simplified circuit diagram of a power-on-reset circuit 60 according to an embodiment of the present invention. As shown in FIG. 6, the power-on-reset circuit 60 includes a NAND gate 601, a first inverter 602, a second inverter 603, a third inverter 604, a last-stage inverter 605, a capacitor 606, a first NMOS transistor 607, a second NMOS transistor 608, a first PMOS transistor 609, a second PMOS transistor 610, a third PMOS transistor 611, a third NMOS transistor 612, and a fourth NMOS transistor 613.

The NAND gate 601 has an output terminal connected to an input terminal of the first inverter 602. The first inverter has an output terminal connected to an output terminal Vout of the power-on-reset circuit 60. The NAND gate has two input terminals each are separately and respectively connected to a power supply voltage VDD and an output terminal of the last inverter 605 at a node A.

The second inverter 603, the third inverter 604, and the last-stage inverter 605 are connected in series to form the set of inverters 404. The second inverter 603 has an input terminal connected to one terminal of the capacitor 606 at a node C. The other terminal of the capacitor 606 is connected to the power supply voltage VDD.

The first NMOS transistor 607 has a drain connected to the second inverter 603 at the node C, a source and a substrate connected to a low supply voltage VSS, and a gate connected to a drain of the first PMOS transistor 609 at a node B. The first PMOS transistor 609 has a gate connected to output terminal Vout, a source connected to a drain of the third PMOS transistor, a substrate connected to VDD. The third PMOS transistor has a gate connected to its drain, and a substrate and a source connected to VDD. The fourth NMOS transistor has a gate and a drain connected to the drain of the first PMOS transistor at the node B, and a substrate and a source connected to VSS.

The second PMOS transistor 610 has a source and a substrate connected to the output terminal of the last-stage inverter 605 at the node A, a drain and gate connected to the gate of the second NMOS transistor 608. The second NMOS transistor 608 has a drain connected to the input terminal of the second inverter 603 at the node C, a source and a substrate connected to VSS. The third NMOS transistor 612 gas a drain connected to the gate of the second NMOS transistor 608, and a source, a substrate, and a gate connected to VSS.

In the embodiment, the input terminal at the node C of the second inverter 603 and the output terminal at the node A of the last-stage inverter 605 initially have a low voltage level, so that the output signal Vout is also low. When the power supply voltage VDD starts rising, the capacitor 606 charges up, the voltage at the node C starts increasing, the voltage at the node A remains low, so that the output signal Vout remains low.

As the power supply voltage VDD keeps increasing, the voltage difference between VDD and Vout increases. When the voltage difference reaches the turn-on voltage of the first PMOS transistor 609, the first PMOS transistor 609 turns on, so that the voltage of its drain at the node B rises. When the voltage at the node B reaches the turn-on voltage of the first NMOS transistor 607, the first NMOS transistor 607 turns on pulling the voltage at the node C low, and the voltage at the node A is pulled high. When both the voltage of VDD and the voltage of the node A reach the high threshold voltage, the signal output Vout transitions from low to high, thereby realizing the reset function of the power-on-reset circuit.

Furthermore, in the embodiment, the second NMOS transistor 608 together with the second PMOS transistor realize the feedback function. That is, when the voltage at the node A rises to the high level, the voltage at the gate of the second NMOS also rises, so that the second NMOS transistor 608 turns on keeping the voltage at the node C low, which, in turn, keeps the voltage at the node A high. Thus, the feedback module 505 through the second NMOS transistor 608 and the second PMOS transistor 610 can maintain the stability of the voltage at Vout after the low-to-high transition and effectively prevent interference effects from occurring.

It is to be appreciated that, the second PMOS transistor 610, the third PMOS transistor 611, the third NMOS transistor 612, and the fourth NMOS transistor 613 are connected as diode types to achieve stable voltage drops.

Moreover, the power-on-reset circuit further includes a power-fail reset function, namely, when VDD decreases to a certain threshold value, Vout transitions from high to low, the voltage at the node A decreases. When VDD returns to high again, the increase in the voltage difference between VDD and Vout turns on the first PMOS transistor 609, so that the voltage at the node B increases and turns on the first NMOS transistor 607. The turning-on of the first NMOS transistor 607 pulls the voltage at the node C low, so that the voltage at the node A increases. When the voltage at the node A is restored to a high voltage level, the voltage of Vout returns from low to high, thereby realizing the reset function of the power-on-reset circuit.

Figure 7:
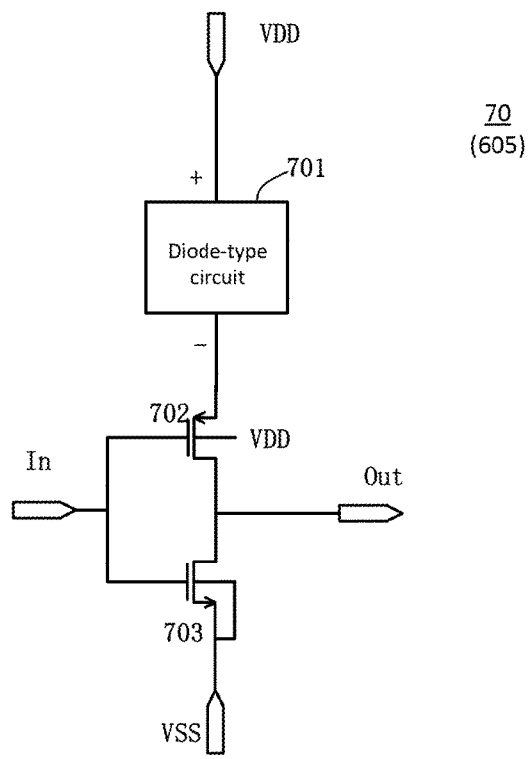
FIG. 7 is a simplified circuit block diagram of an inverter used for a power-on-reset circuit according to an embodiment of the present invention.

In some embodiments, the last-stage inverter 605 has a special design. FIG. 7 is a simplified circuit block diagram of a last-stage invertor 70 used for a power-on-reset circuit according to an embodiment of the present invention. Referring to FIG. 7, the invertor 70 may be used as the last-stage inverter 605 of FIG. 6. The invertor 70 includes a diode-type circuit 701, a fourth PMOS transistor 702 and a fifth NMOS transistor 703.

The diode-type circuit 701 has a positive terminal connected to VDD and a negative terminal connected to a source of the fourth PMOS transistor 702. The fourth PMOS transistor 702 has a gate connected to the input terminal of the last-stage inverter 605, a drain connected to the output terminal of the last-stage inverter 605, and a substrate connected to VDD. The fifth NMOS transistor 703 has a drain connected to the output terminal of the last-stage inverter 605, a gate connected to the input terminal of the last-stage inverter 605, a source and a substrate connected to VSS.

In the embodiment, the diode-type circuit 701 can generate a stable voltage drop, so that the voltage at the output terminal of the last-stage inverter 605 is lower than VDD.

In a specific embodiment, by using the last-stage inverter of FIG. 7 as the last-stage inverter 605 of FIG. 6, the voltage at the node A is lower than VDD. That is, the voltage at the node C can be lower than the trigger voltage of the normal inverter to cause the last-stage inverter to flip, thereby improving the sensitivity of the power-on-reset circuit while reducing the power consumption of the last-stage inverter 605.

Figure 8:
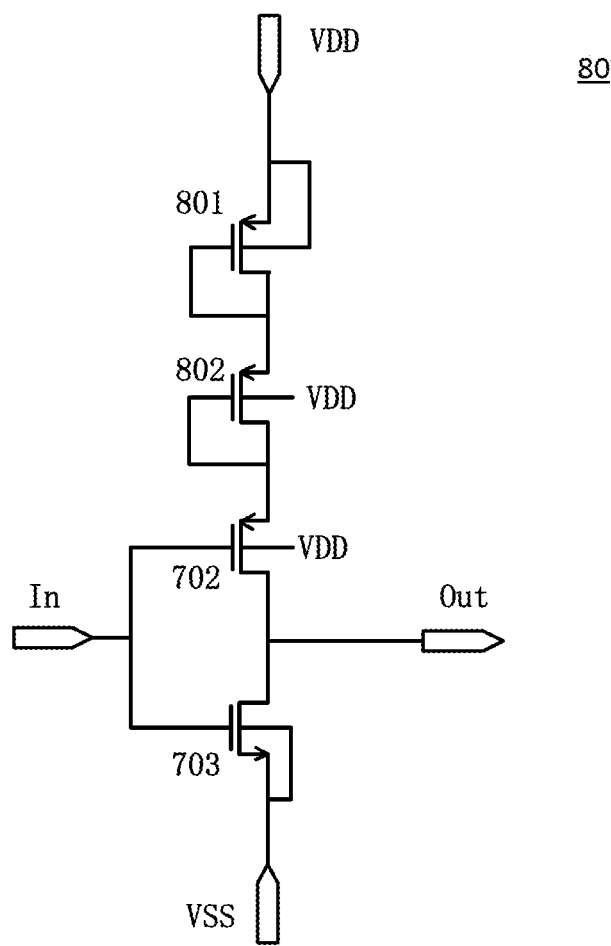
FIG. 8 is a simplified circuit diagram of an inverter used for a power-on-reset circuit according to an embodiment of the present invention.

FIG. 8 is a simplified circuit diagram of a last-stage invertor used for a power-on-reset circuit according to an embodiment of the present invention. Referring to FIG. 8, the diode type circuit 701 of FIG. 7 may include a fifth PMOS transistor 801, and a sixth PMOS transistor 802. The fifth PMOS transistor 801 has a source and a substrate connected to VDD, a gate and a drain connected to a source of the sixth PMOS transistor 802. The sixth PMOS transistor 802 has a gate and a drain connected to the source of the fourth PMOS transistor 702, and a substrate connected to VDD.

Since the gate and the drain of the fifth and sixth PMOS transistors are connected to each other, the fifth and sixth PMOS transistors each have the characteristics of a diode and generate a stable voltage drop, so that the voltage of the source of the fourth PMOS transistor 702 is lower than VDD, so that the voltage at the input terminal of the last-stage inverter 605 is lower than the trigger voltage of the normal inverter to cause the last-stage inverter to flip.

Figure 9:
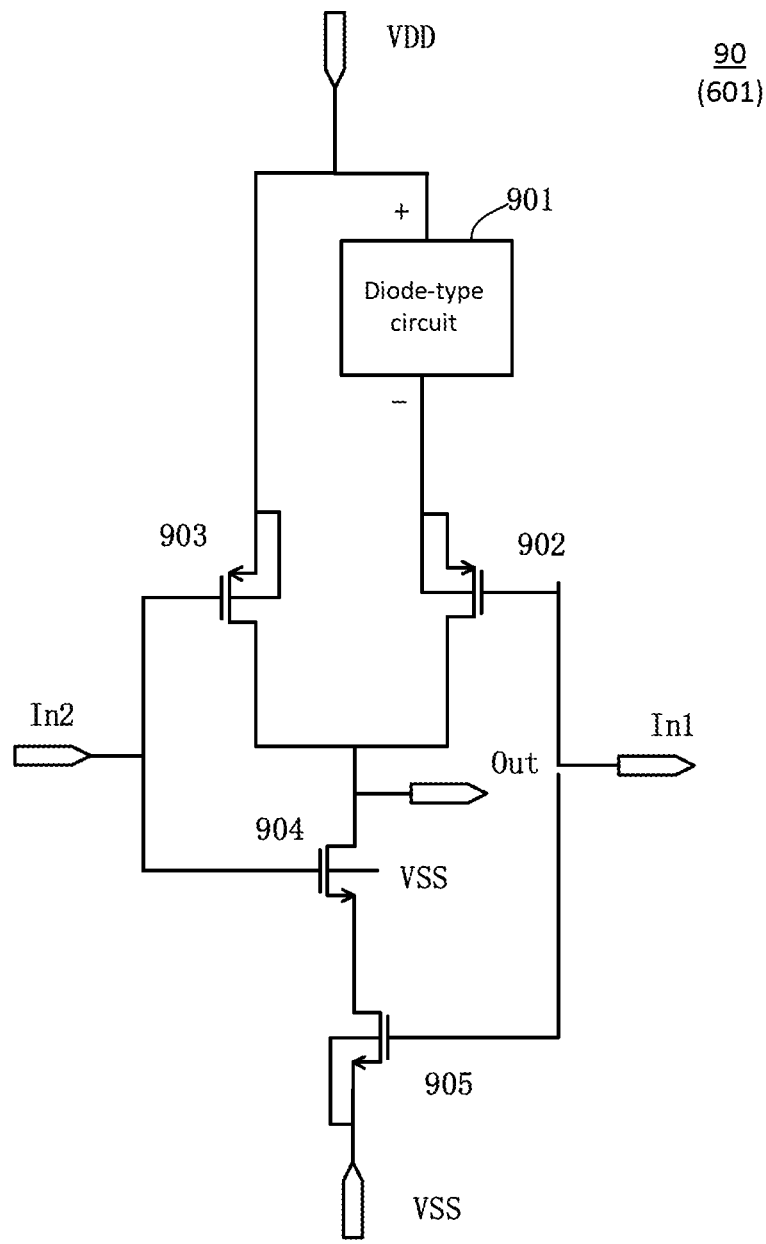
FIG. 9 is a simplified circuit block diagram of a NAND gate used for a power-on-reset circuit according to an embodiment of the present invention.

In an embodiment, the NAND gate 601 of FIG. 6 may be a low-power design. FIG. 9 is a simplified circuit diagram illustrating a NAND gate 601 used for a power-on-reset circuit according to an embodiment of the present invention. Referring to FIG. 9, the NAND gate 601 includes a diode-type circuit 901, a seventh PMOS transistor 902, an eighth PMOS transistor 903, a sixth NMOS transistor 904, and a seventh NMOS transistor 905.

The diode-type circuit 901 has a positive terminal connected to VDD and a negative terminal connected to a source and a substrate of the seventh PMOS transistor 902. The seventh PMOS transistor 902 has a gate connected to an input terminal In1 of the NAND gate 601, and a drain connected to the output terminal Out of the NAND gate 601. The eighth PMOS transistor 903 has a source and a substrate connected to VDD, a gate connected to an input terminal In2 of the NAND gate 601, a drain connected to the output Out of the NAND gate 601. The sixth NMOS transistor 904 has a drain connected to the output terminal Out of the NAND gate 601, a source connected to the drain of the seventh NMOS transistor 905, and a substrate connected to VSS. The seventh NMOS transistor 905 has a gate connected to the input terminal In1 of the NAND gate 601, and a source and a substrate connected to VSS.

Since the input terminal In1 of the NAND gate 601 is required to the output terminal of the last-stage inverter 605, and the output voltage of the last-stage inverter 605 is lower than VDD, so that the voltage of the input terminal In1 is lower than VDD, thus, the transition voltage of the NAND gate 601 is not at VDD/2 to prevent current leakage. In the embodiment, through the source of the seventh PMOS transistor 902 connected in series with a reversed biased diode type circuit 901, the transition voltage of the NAND gate 601 is not at VDD/2, thereby preventing current leakage and reducing the power consumption of the NAND gate 601.

Figure 10:
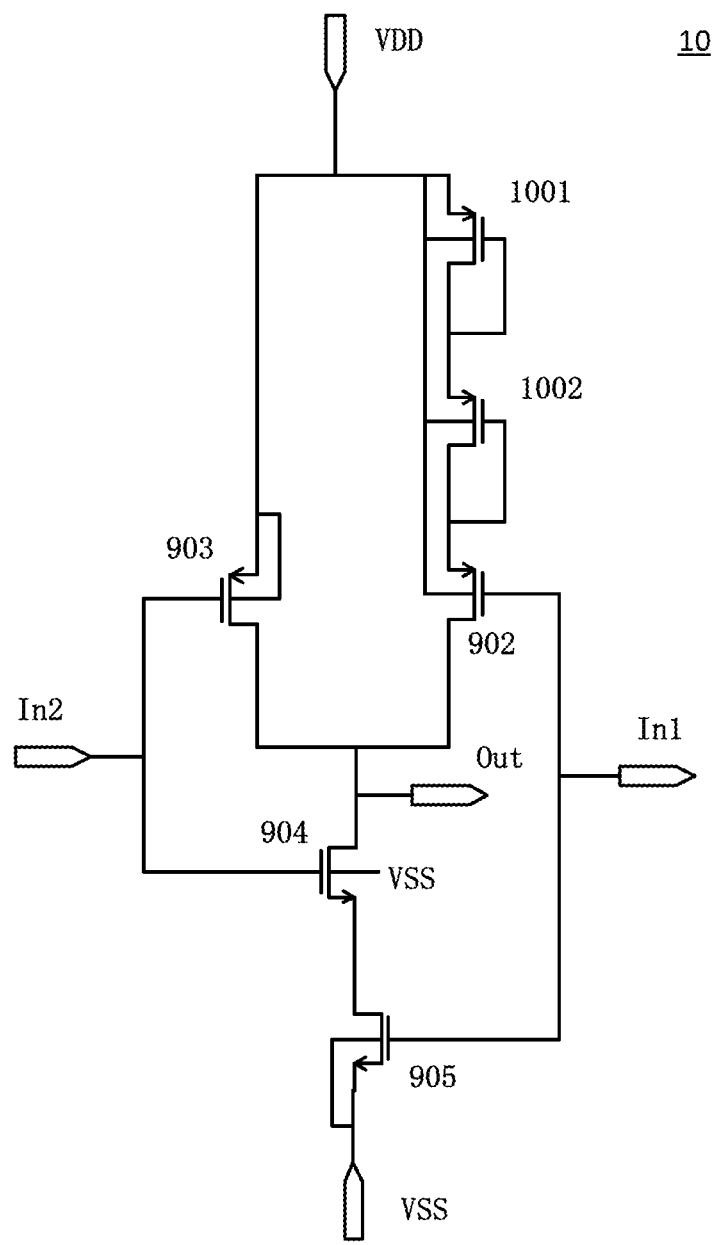
FIG. 10 is a simplified circuit diagram of a NAND gate used for a power-on-reset circuit according to an embodiment of the present invention.

FIG. 10 is a simplified circuit diagram illustrating a NAND gate 601 used for a power-on-reset circuit according to an embodiment of the present invention. Referring to FIG. 10, the diode-type diode 901 may be implemented using a ninth PMOS transistor 1001 and a tenth PMOS transistor 1002. The ninth PMOS transistor has a source and a substrate connected to VDD, a gate and a drain connected to a source of the tenth PMOS transistor 1002. The tenth PMOS transistor 1002 has a gate and a drain connected to the source of the seventh PMOS transistor 902, and a substrate connected to VDD. Since the gate and drain of the ninth and tenth PMOS transistors are connected to each other, the ninth and tenth PMOS transistors have the electrical characteristics similar to those of a diode, and their connection in series in the forward biased direction generates a stable voltage drop, the transition voltage of the NAND gate 601 is not at VDD/2, thereby preventing current leakage and reducing the power consumption of the NAND gate 601.

Embodiments of the present invention provides a power-on-reset circuit that can effectively reduces the power consumption through the low power design of the NAND gate 601 and the last-stage inverter 605. According to the present invention, the power-on-reset circuit also supports the power-fail reset function. Comparing with conventional power-on-reset circuits, the power-on-reset circuit according to embodiments of the present invention has lower costs and can be fully integrated on a chip.

Figure 11:
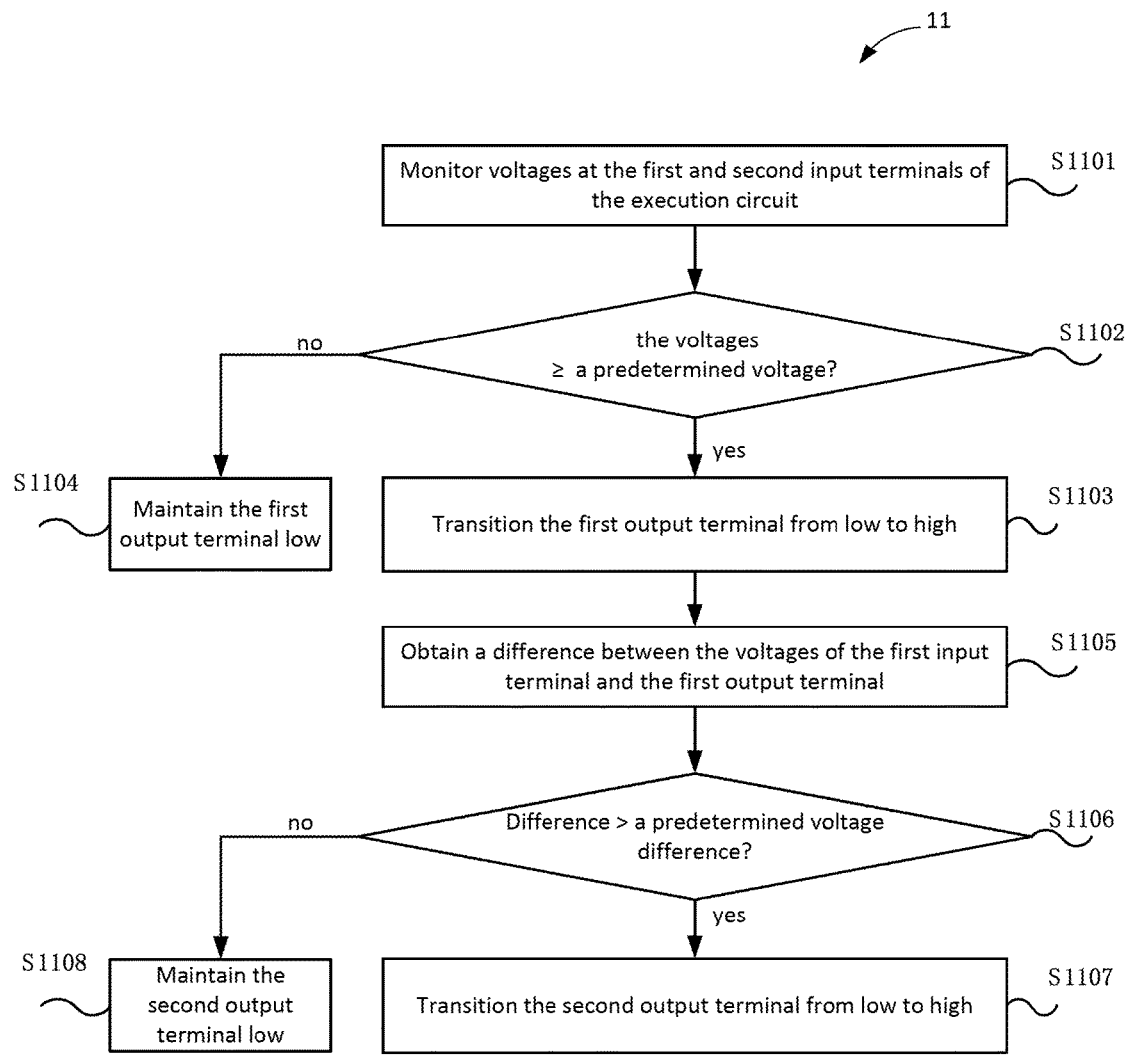
FIG. 11 is a flowchart diagram illustrating a method for operating a power-on-reset circuit according to an embodiment of the present invention.

FIG. 11 is a flowchart diagram illustrating a method 11 for operating a power-on-reset circuit according to an embodiment of the present invention. The power-on-reset circuit includes an execution circuit having first and second input terminals and a first output terminal, and a control circuit having a third input terminal connected to the first output terminal, a fourth input terminal connected to the first input terminal, and a second output terminal connected to the second input terminal (See FIG. 2). Referring to FIG. 11, the method 11 includes:

S1101: monitoring a voltage at the first input terminal and a voltage at the second input terminal of the execution circuit.

S1102: determining whether the voltages at the respective first and second input terminals are not less than a predetermined voltage. If the voltages at the first and second input terminals are not less than (i.e., equal to or greater than) the predetermined voltage, go to S1103, otherwise go to S1104.

S1103: transitioning a voltage at the first output terminal of the execution circuit from low to high. The first input terminal is connected to a power supply voltage, and the second input terminal has a low level voltage level at an initial state. Continue to S1105.

In some embodiments, steps S1101 to S1103 may be implemented using logic gates, or using combinations of NAND gates and inverters.

S1104: maintaining the voltage at the first output terminal of the execution circuit low.

S1105: obtaining a voltage difference between the power supply voltage at the first input terminal and the voltage at the first output terminal of the execution circuit by the control circuit.

S1106: determining whether the voltage difference is greater than a predetermined voltage difference.

In the event that the voltage difference is greater than the predetermined voltage, go to S1107; otherwise go to S1108.

S1107: transitioning the voltage of the output terminal of the control circuit from low to high.

S1108: maintaining the voltage of the output terminal of the control circuit low.

In an embodiment, the control circuit includes a third input terminal, a fourth input terminal, and a second output terminal. The third input terminal is connected to the first output terminal of the execution circuit. The fourth input terminal is connected to the first input terminal. The second output terminal is connected to the second input terminal.

The method for operating a power-on-reset circuit according to some embodiments of the present invention includes determining whether both the voltages at the respective first and second inputs are less than a predetermined voltage. If both the voltages at the respective first and second inputs are not less than the predetermined voltage, transitioning the first output terminal of the execution circuit from low to high. The first input terminal is connected to a power supply voltage, the initial state of the second input terminal is low. The method also includes determining a voltage difference between the first input terminal and the first output terminal by a control circuit. When the voltage difference is determined to be greater than a predetermined voltage difference, the second output terminal is transitioned from low to high by the control circuit. The method for operating a power-on-reset circuit can be applied to applications with a wide voltage range and provides different slew rates of the reset signal.

In some embodiments, the power-on reset method also includes maintaining the voltage of the second input terminal low if the voltage at the second input terminal is less than the predetermined voltage.

In some embodiments, referring to FIG. 4, the control circuit may include a charge module, a voltage difference module, a step-down module and a set of inverter. Maintaining the voltage of the second input terminal low includes charging the charge module of the control circuit when the voltage at the first input terminal ramps up to increase the voltage at an output terminal of the charge module. The input terminal of the charge module is connected to the first input terminal, and the output terminal of the charge module is connected to an input terminal of the set of inverters.

When the voltage at the input terminal of the set of inverters reaches the high logic level, the output terminal is inverted to a logic low. The output terminal of the set of inverters is connected to the second input terminal.

Figure 12:
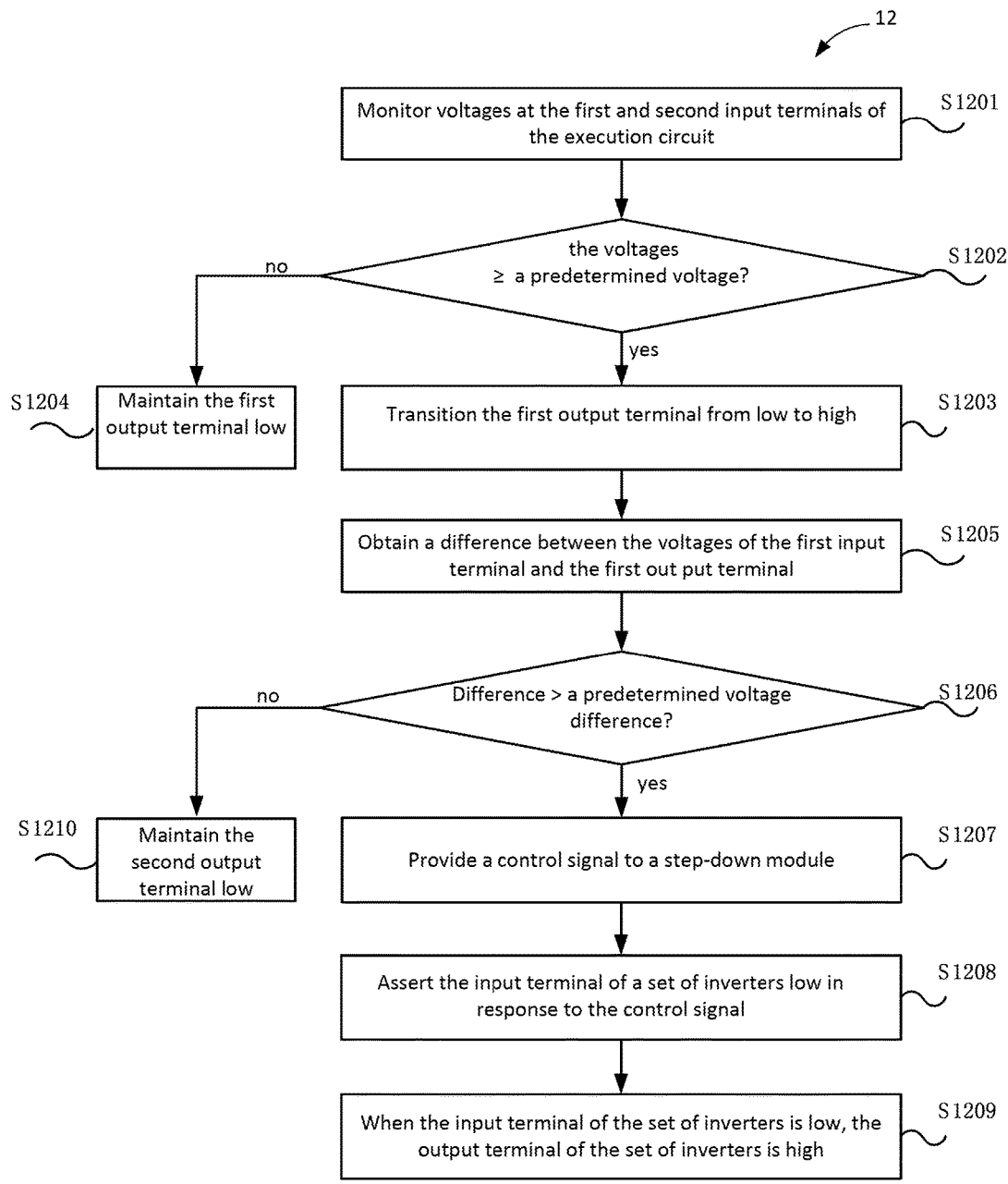
FIG. 12 is a flowchart diagram illustrating a method for operating a power-on-reset circuit according to another embodiment of the present invention.

FIG. 12 is a flowchart diagram illustrating a method 12 for operating a power-on-reset circuit according to another embodiment of the present invention. The power-on-reset circuit includes an execution circuit having first and second input terminals and a first output terminal, and a control circuit having a third input terminal connected to the first output terminal, a fourth input terminal connected to the first input terminal, and a second output terminal connected to the second input terminal (See FIG. 2). The control circuit includes a charge module connected to the first input terminal, a voltage difference detection module connected to the first input terminal, a step down module connected to the voltage difference detection module, and a set of inverters coupled to the charge module, the step-down module, and the execution circuit (see FIG. 4).

Referring to FIG. 12, the method 12 includes:

S1201: monitoring a first voltage at the first input terminal and a second voltage at the second input terminal of the execution circuit.

S1202: determining if both the first and second voltages are not less than a predetermined voltage. If the first voltage and the second voltage are not less than (i.e., equal to or greater than) the predetermined voltage (i.e., S1202 is true), go to S1203, otherwise (i.e., S1202 is false) go to S1204.

S1203: transitioning an output voltage at the first output terminal of the execution circuit from a low level to a high level. The first input terminal is connected to a power supply voltage, and the second input terminal is connected to a low voltage level at an initial state. Continue to S1205.

S1204: keeping the voltage at the first output terminal of the execution circuit at the low level.

S1205: obtaining a voltage difference between the voltage at the first input terminal and the voltage at the first output terminal of the execution circuit by the voltage difference detection module of the control circuit.

S1206: determining by the voltage difference detection module whether the voltage difference is greater than a predetermined voltage difference.

In the event that the voltage difference is greater than the predetermined voltage difference (S1206 is true), go to S1207; otherwise (S1206 is false) go to S1210.

S1207: transmitting a control signal by the voltage difference detection module to the step-down module.

The voltage difference detection module has two input terminals each separately connected to the first input terminal and the first output terminal, and an output terminal connected to an input terminal of the step-down module.

S1208: asserting the voltage at the input terminal of the set of inverters low by the step-down module in response to the control signal.

The step-down module has an input terminal connected to the input terminal of the set of the inverters and to the charge module.

S1209: asserting the voltage at an output terminal of the set of inverters high by the low level at the input terminal of the set of inverters. The output terminal of the set of inverters is connected to the second output terminal of the control circuit.

S1210: maintaining the voltage at the second output terminal of the control circuit at a low level.

In some embodiments, the method may further include: when the second input terminal is at a high level, maintaining the voltage at the input terminal of the set of inverters at a low level by a feedback module. The feedback module has an input terminal connected to the second input terminal and an output terminal connected to the input terminal of the set of inverters.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A power-on-reset circuit comprising:
    an execution circuit comprising a first input terminal, a second input terminal, and a first output terminal, the first input terminal directly connected to a power supply voltage, a voltage at the second input terminal having a low level at an initial state, and a voltage at the first output terminal having a low level, wherein the voltage at the first output terminal transitions from the low level to a high level when the power supply voltage at the first input terminal and the voltage at the second input terminal are not less than a predetermined voltage; and
    a control circuit comprising a third input terminal connected to the first output terminal, a fourth input terminal connected to the first input terminal, and a second output terminal connected to the second input terminal, wherein the voltage at the second input terminal transitions from the low level to the high level when a difference between the power supply voltage at the first input terminal and the voltage at the first output terminal is greater than a predetermined voltage difference,
    wherein the execution circuit comprises a NAND gate having a first input terminal directly connected to the first input terminal of the execution circuit, a gate connected to the second input terminal of the execution circuit, a drain connected to the output terminal of the NAND gate, a source connected in series with a reverse-biased diode circuit to the power supply voltage, and a substrate connected to the power supply voltage.

2. The power-on-reset circuit of claim 1, wherein the execution circuit further comprises an inverter, the NAND gate further having a second input terminal connected to the second input terminal of the execution circuit, and an output terminal connected to an input terminal of the inverter, and the inverter having an output terminal connected to the first output terminal of the execution circuit.

3. The power-on-reset circuit of claim 1, wherein the control circuit comprises:
    a charge module;
    a voltage difference detection module;
    a step-down module; and
    a set of inverters,
    wherein:
    the charge module comprises an input terminal connected to the first input terminal of the execution circuit, an output terminal connected to an input terminal of the set of inverters, the charge module is configured to be charged to raise a voltage at its output terminal when the power supply voltage starts rising;
    the voltage difference detection module comprises a first input terminal connected to the first input terminal of the execution circuit, a second input terminal connected to the first output terminal of the execution circuit, and an output terminal connected to an input terminal of the step-down module, the voltage difference detection module is configured to provide a control signal to the step-down module when the difference between the power supply voltage at the first input terminal and the voltage at the first output terminal is greater than the predetermined voltage;
    the step-down module comprises an input terminal connected to an input terminal of the set of inverters, the step-down module is configured to drive a voltage at the input terminal of the set of inverters to the low level in response to the control signal; and
    the set of inverters comprises an output terminal connected to the second input terminal of the execution circuit, the set of inverters is configured to convert a low level signal at its input terminal to a high level signal at its output terminal, and convert a high level signal at its input terminal to a low level signal at its output terminal.

4. The power-on-reset circuit of claim 3, wherein the charge module includes a capacitor.

5. The power-on-reset circuit of claim 3, wherein the voltage difference detection module comprises a first PMOS transistor having a substrate connected to the first input terminal of the execution circuit, a gate connected to the first output terminal of the execution circuit, a source connected in series with a reverse-biased diode circuit to the power supply voltage, and a drain connected in series to a forward biased diode circuit to a low voltage terminal.

6. The power-on-reset circuit of claim 5, wherein the step-down module comprises a first NMOS transistor having a gate connected to the drain of the first PMOS transistor, a drain connected to the input terminal the input terminal of the set of inverters, and a source and a substrate connected to the low voltage terminal.

7. The power-on-reset circuit of claim 3, wherein the control circuit further comprises a feedback module having an input terminal connected to the second input terminal of the execution circuit, an output terminal connected to the input terminal of the set of inverters, the feedback module is configured to maintain the voltage at the input terminal of the set of inverters at the low level when the voltage at the second input terminal of the execution circuit is at the high level.

8. The power-on-reset circuit of claim 7, wherein the feedback module comprises a second PMOS transistor and a second NMOS transistor, the second PMOS transistor having a source and a substrate connected to the second input terminal of the execution circuit, a gate and a drain connected to a gate of the NMOS transistor, the NMOS transistor having a drain connected to the input terminal of the set of inverters, a source and a substrate connected to a low voltage terminal.

9. The power-on-reset circuit of claim 3, wherein the set of inverters comprises an odd number of inverters including a last-stage inverter, the last-stage inverter having an output terminal connected to the second input terminal of the execution circuit.

10. The power-on-reset circuit of claim 9, wherein the last-stage inverter comprises a third PMOS transistor having a gate connected to its input terminal, a drain connected to its output terminal, a source connected in series with a reverse-biased diode-type circuit to the power supply voltage, and a substrate connected to the power supply voltage.

11. The power-on-reset circuit of claim 1, wherein the diode circuit comprises a p-channel MOS transistor or an n-channel MOS transistor having a drain and a gate connected to each other.

12. The power-on-reset circuit of claim 1, wherein the predetermined voltage is a threshold voltage of the execution circuit.

13. The power-on-reset circuit of claim 1, wherein the predetermined voltage difference is a turn-on voltage of the PMOS transistor.

14. A method for operation a power-on-reset circuit including an execution circuit having first and second input terminals and a first output terminal, and a control circuit having a third input terminal connected to the first output terminal, a fourth input terminal connected to the first input terminal, and a second output terminal connected to the second input terminal, the first input terminal directly connected to a power supply voltage, and a voltage at the second terminal being a low level at an initial state, wherein the execution circuit comprises a NAND gate having a first input terminal directly connected to the first input terminal of the execution circuit, a gate connected to the second input terminal of the execution circuit, a drain connected to the output terminal of the NAND gate, a source connected in series with a reverse-biased diode circuit to the power supply voltage, and a substrate connected to the power supply voltage, the method comprising:
monitoring a voltage at the first input terminal and a voltage at the second input terminal,
transitioning a voltage at the first output terminal of the execution circuit from a low level to a high level if a voltage at the first input terminal and the voltage at the second input terminal are not less than a predetermined voltage;
determining whether a difference between the voltage at the first input terminal and the voltage at the first output voltage is greater than a predetermined voltage difference;
in the event that the difference is greater than the predetermined voltage difference:
transitioning the voltage at the second output terminal from a low level to a high level by the control circuit.

15. The method of claim 14, wherein the execution circuit further comprises an inverter, the NAND gate further having a second input terminal connected to the second input terminal of the execution circuit, and an output terminal connected to an input terminal of the inverter, and the inverter having an output terminal connected to the first output terminal of the execution circuit.

16. The method of claim 14, further comprising:
in the event that the difference is not greater than the predetermined voltage difference, maintaining the voltage at the second input terminal at the low level.

17. The method of claim 16, wherein maintaining the voltage at the second input terminal at the low level comprises:
charging a charge module when the voltage at the first input terminal rises, the charge module having an input terminal connected to the first input terminal and an output terminal connected to an input terminal of the set of inverters;
driving the voltage at the output of the set of inverters to the low level when the voltage at its input terminal reaches the high level, the output terminal of the set of inverters connected to the second input terminal.

18. The method of claim 14, wherein the control circuit comprises a charge module, a voltage difference detection module, a step-down module, and a set of inverters, the method further comprising:
when a difference between the voltage at the first input terminal and a voltage at the second input terminal is determined by the voltage difference detection module to be greater than the predetermined voltage difference, providing a control signal by the voltage difference detection module to the step-down module;
asserting the voltage at the input terminal of the set of inverters low by the step-down module in response to the control signal; and
asserting the voltage at an output terminal of the set of inverters high, the output terminal of the set of inverters connected to the second output terminal.

19. The method of claim 18, further comprising:
maintaining the voltage at the input terminal of the set of inverters to the low level by a feedback module when the voltage at the second input terminal is at the high level, the feedback module having an input terminal connected to the second input terminal.

* * * * *